United States Patent
Ueno et al.

(10) Patent No.: US 11,018,004 B2
(45) Date of Patent: May 25, 2021

(54) METHOD OF MANUFACTURING SEMICONDUCTOR DEVICE

(71) Applicant: Mitsubishi Electric Corporation, Tokyo (JP)

(72) Inventors: Takahiro Ueno, Tokyo (JP); Naohisa Tamada, Tokyo (JP); Motoshi Kitagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 11 days.

(21) Appl. No.: 16/485,156

(22) PCT Filed: Jun. 1, 2017

(86) PCT No.: PCT/JP2017/020480
§ 371 (c)(1),
(2) Date: Aug. 10, 2019

(87) PCT Pub. No.: WO2018/220796
PCT Pub. Date: Dec. 6, 2018

(65) Prior Publication Data
US 2020/0043717 A1    Feb. 6, 2020

(51) Int. Cl.
*G03F 7/26* (2006.01)
*H01L 21/027* (2006.01)
(Continued)

(52) U.S. Cl.
CPC ............ *H01L 21/027* (2013.01); *G03F 7/039* (2013.01); *G03F 7/168* (2013.01); *G03F 7/2004* (2013.01);
(Continued)

(58) Field of Classification Search
CPC ............. H01L 21/0273; H01L 21/0272; H01L 21/0337; H01L 2933/0016
See application file for complete search history.

(56) References Cited

U.S. PATENT DOCUMENTS 6,486,058 B1 * 11/2002 Chun ................. G03F 7/40
                                                257/E21.026
7,371,509 B2 * 5/2008 Hishiro ................ G03F 7/40
                                                430/322
(Continued)

FOREIGN PATENT DOCUMENTS

JP         3908213 B2    4/2007
JP      2008-180813 A    8/2008
(Continued)

OTHER PUBLICATIONS

International Search Report; Written Opinion; and Notification of Transmittal of the International Search Report and the Written Opinion of the International Searching Authority, or the Declaration issued in PCT/JP2017/020480; dated Aug. 22, 2017.
(Continued)

*Primary Examiner* — Bradley Smith
*Assistant Examiner* — David J Goodwin
(74) *Attorney, Agent, or Firm* — Studebaker & Brackett PC (57) ABSTRACT

A method of manufacturing a semiconductor device according to the present invention includes a step of forming an opening portion in a resist coated on a substrate, a step of coating a thermally-shrinking shrink agent on the resist to fill the opening portion with the shrink agent, a shrinking step of heating and thermally shrinking the shrink agent to reduce a width of the opening portion, a removing step of removing the shrink agent after the shrinking step, a step of forming a metal layer on the resist and in the opening portion after the removing step and a step of removing a portion of the metal layer above the resist and the resist, wherein in the shrinking step, a side surface of the resist forming the opening portion forms a curved surface protruding toward a center portion of the opening portion.

5 Claims, 11 Drawing Sheets

(51) Int. Cl.
*G03F 7/039* (2006.01)
*G03F 7/16* (2006.01)
*G03F 7/20* (2006.01)
*G03F 7/32* (2006.01)
*G03F 7/38* (2006.01)
*G03F 7/40* (2006.01)
*H01L 21/285* (2006.01)

(52) U.S. Cl.
CPC ............... *G03F 7/322* (2013.01); *G03F 7/38* (2013.01); *G03F 7/40* (2013.01); *H01L 21/28506* (2013.01)

(56) References Cited

U.S. PATENT DOCUMENTS

| | | | | |
|---|---|---|---|---|
| 8,097,398 | B2* | 1/2012 | Kondoh | G03F 7/40 430/273.1 |
| 8,795,949 | B2* | 8/2014 | Kozawa | H01L 21/76802 430/270.1 |
| 2005/0069813 | A1* | 3/2005 | Sawada | G03F 7/40 430/311 |
| 2005/0250055 | A1* | 11/2005 | Hishiro | H01L 21/312 430/330 |
| 2006/0240338 | A1* | 10/2006 | Satoh | H01L 21/76838 430/5 |
| 2010/0090372 | A1 | 4/2010 | Ishikawa et al. | |
| 2010/0255430 | A1* | 10/2010 | Dammel | G03F 7/0757 430/325 |
| 2013/0216957 | A1 | 8/2013 | Park et al. | |
| 2014/0363915 | A1* | 12/2014 | Tsai | H01L 51/0002 438/46 |
| 2017/0271155 | A1* | 9/2017 | Lai | H01L 21/0274 |

FOREIGN PATENT DOCUMENTS

| | | |
|---|---|---|
| JP | 2013-133471 A | 7/2013 |
| WO | 2005/045911 A1 | 5/2005 |

OTHER PUBLICATIONS

Hah Jung Hwan, et al., "Most Efficient Alternative Manner of Patterning sub-80nm Contact Holes and Trenches with 193nm Lithography" Japanese Journal of Applied Physics, Jun. 29, 2004, vol. 43, No. 68, pp. 3663-3667.

Chen Wei-Su, et al., "Sub-10nm Contact Holes with Aspect Ratio over Sixty Formed by E-beam Resist Shrinkage Techniques" Proc. of SPIE, Mar. 22, 2007, vol. 6519, pp. 651945-1-651945-12.

Office Action issued in JP 2017-548239; mailed by the Japanese Patent Office dated Oct. 17, 2017.

Office Action issued in JP 2017-548239; mailed by the Japanese Patent Office dated Jan. 16, 2018.

* cited by examiner

METHOD OF MANUFACTURING SEMICONDUCTOR DEVICE

FIELD

The present invention relates to a method of manufacturing a semiconductor device.

BACKGROUND

PTL 1 discloses a method of forming a resist pattern having an opening portion smaller than a resolution limit of a photoresist. According to this method, a side wall portion of the opening portion is configured to be reversely tapered by swelling the photoresist having the opening portion formed therein.

CITATION LIST

Patent Literature

[PTL 1] JP 3908213 A

SUMMARY

Technical Problem

In general, reduction of gate capacitance is effective for enhancement of the performance of a transistor. This may cause a requirement for reducing the gate head dimension. Here, in a gate electrode process based on lift-off, an opening portion corresponding to the dimension of a gate electrode is formed in the photoresist. At this time, the resolution limit of the photoresist may limit the reduction of the electrode pattern.

Electron beam exposure may be used as a method of forming a resist pattern with the resolution limit of the photoresist or less. However, resist patterns are generally directly drawn one by one in the electron beam exposure, and thus the throughput is lower as compared with optical exposure, so that the productivity may be degraded.

In the method of forming a resist pattern according to PTL 1, there is a possibility that a resist scum in the opening portion grows due to a swelling treatment. Therefore, there is a possibility that a resist residue at the bottom of the pattern cannot be removed in a later step. Furthermore, in PTL 1, a photoresist and a swelled film chemically react at the end face of the opening portion, so that the photoresist grows. At this time, there is a possibility that the opening portion is clogged due to repetition of the swelling treatment.

The present invention has been made to solve the above-described problems, and has an object to obtain a method of manufacturing a semiconductor device capable of reducing the dimension of an electrode pattern.

Solution to Problem

A method of manufacturing a semiconductor device according to the present invention includes a step of coating a resist on an upper surface of a substrate, a step of forming an opening portion in the resist, a shrink agent coating step of coating a thermally-shrinking shrink agent on the resist to fill the opening portion with the shrink agent, a shrinking step of heating and thermally shrinking the shrink agent to reduce a width of the opening portion, a removing step of removing the shrink agent after the shrinking step, a metal layer forming step of forming a metal layer on the resist and in the opening portion after the removing step and a step of removing a portion of the metal layer above the resist and the resist, wherein in the shrinking step, a side surface of the resist forming the opening portion forms a curved surface protruding toward a center portion of the opening portion at a central portion in a thickness direction of the resist, and in the removing step, the shrink agent is removed by a water-washing treatment.

Advantageous Effects of Invention

In the method of manufacturing a semiconductor device according to the invention of the present application, the width of the opening portion of the resist is narrowed by the stress caused by the thermal shrinkage of a shrink agent. Therefore, the dimension of the electrode pattern can be reduced.

DESCRIPTION OF EMBODIMENTS

A method of manufacturing a semiconductor device according to an embodiment of the present invention are described with reference to drawings. Identical or corresponding constitutional elements are given the same reference numerals, and the repeated description of such constitutional elements may be omitted.

First Embodiment

Figure 1:
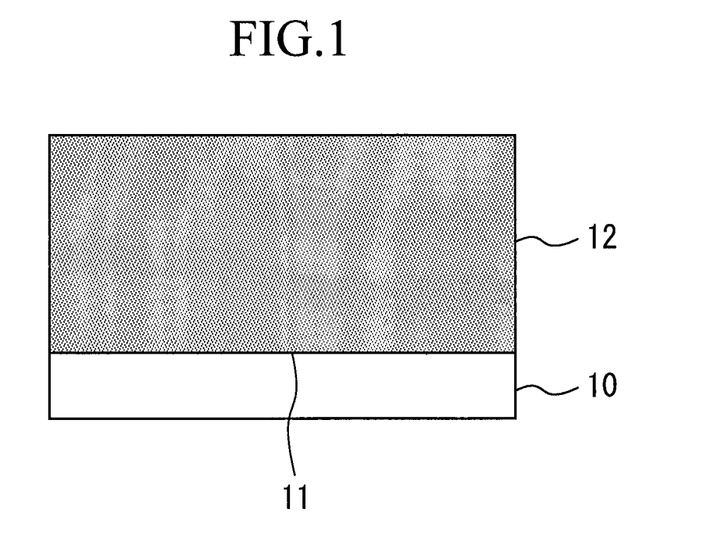
FIG. 1 is a cross-sectional view showing a method of manufacturing a semiconductor device according to a first embodiment.

FIG. 1 is a cross-sectional view showing a method of manufacturing a semiconductor device according to a first embodiment. First, a resist 12 is coated on an upper surface 11 of a substrate 10. The resist 12 is a photoresist. Furthermore, the resist 12 is a positive resist. Next, the substrate 10 and the resist 12 are prebaked at 90° C. to 120° C. This causes solvent contained in the resist 12 to volatilize. In order to form a fine pattern, it is desirable that the resist 12 is a high-resolution resist. For example, AR 80 (trade name) manufactured by Tokyo Ohka Kogyo Co., Ltd. can be used as the resist 12. The film thickness of the resist 12 is about 0.8 μm. The thickness of the resist is set to be twice or more as large as the thickness of a metal layer formed on the substrate 10.

Figure 2:
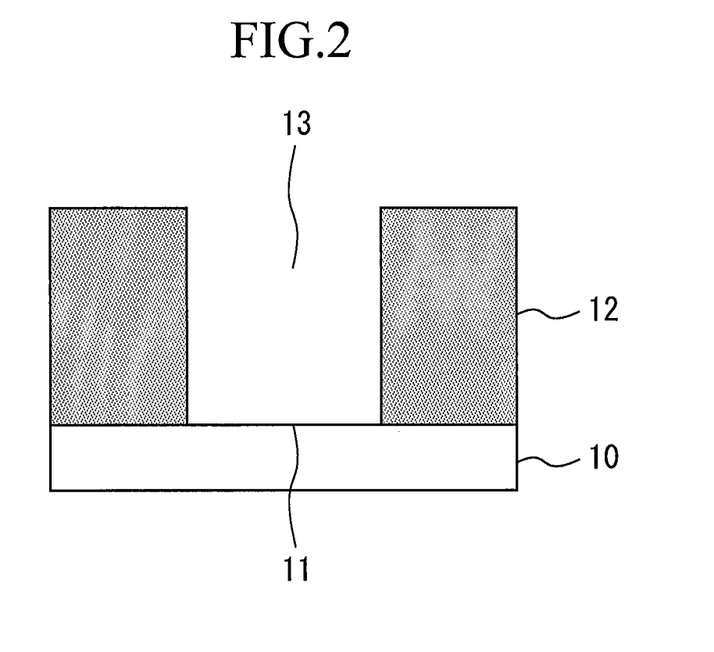
FIG. 2 is a cross-sectional view showing a state in which an opening portion has been formed in the resist in the first embodiment.

Next, a step of forming an opening portion in the resist 12 to expose the substrate 10 is performed. FIG. 2 is a cross-sectional view showing a state in which an opening portion 13 has been formed in the resist 12 in the first embodiment. First, the resist 12 is exposed with a mask. In the exposure, an exposure apparatus such as an i-line stepper using light having a wavelength of 365 nm is used. Next, post-exposure bake is performed at 110° C. Next, the resist 12 is developed with an alkaline developer. For example, NMD-3 (trade name) manufactured by Tokyo Ohka Kogyo Co., Ltd., which is TMAH (Tetramethyl Ammonium Hydroxide) having a concentration of 2.38%, can be used as the alkaline developer. As a result, the opening portion 13 is formed in the resist 12. In the present embodiment, the width of the opening portion 13 is 0.40 μm. The width of the opening portion 13 is not limited to this value.

Figure 3:
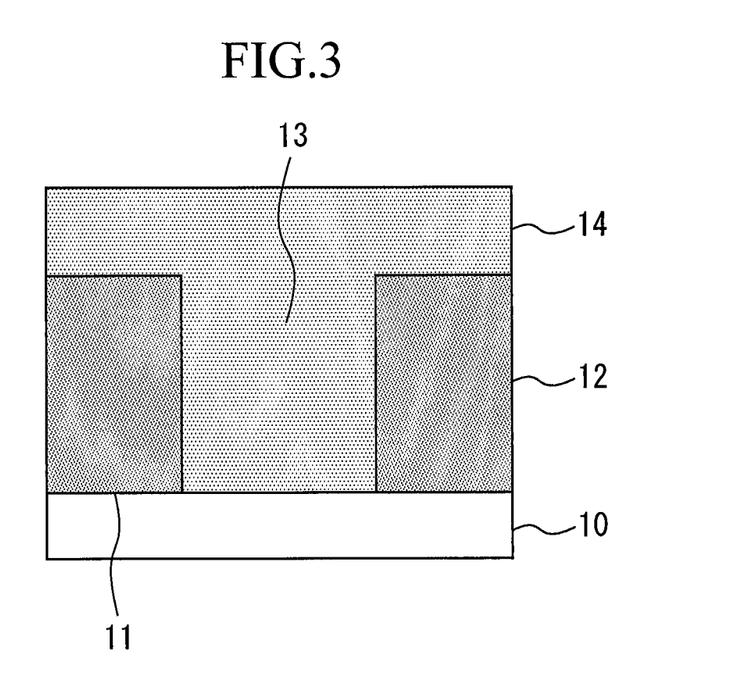
FIG. 3 is a diagram showing the shrink agent coating step of the first embodiment.

Next, a shrink agent coating step is performed. FIG. 3 is a diagram showing the shrink agent coating step of the first embodiment. In the shrink agent coating step, a thermally-shrinking shrink agent 14 is coated onto the resist 12 to fill the opening portion 13. The shrink agent 14 includes a water-soluble polymer as a main component. The shrink agent 14 does not react with the resist 12. In addition, the shrink agent 14 shrinks due to a heat treatment. For example, a pattern shrink agent such as FSC-5000EX (trade name) manufactured by Tokyo Ohka Kogyo Co., Ltd. can be used as the shrink agent 14.

Figure 4:
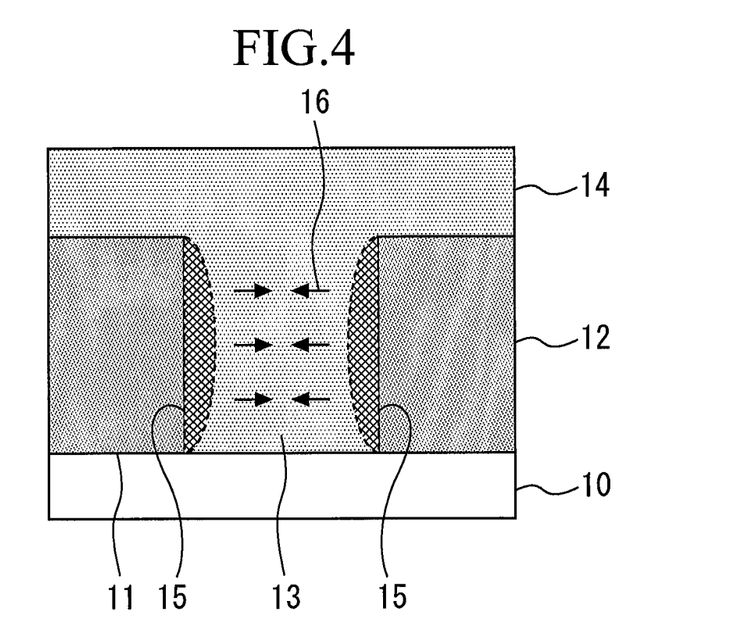
FIG. 4 is a diagram showing the shrinking step of the first embodiment.

Next, a shrinking step is performed. FIG. 4 is a diagram showing the shrinking step of the first embodiment. In the shrinking step, the shrink agent 14 is heated and thermally shrunk. In the present embodiment, the shrink agent 14 is baked at 110° C. to 130° C. The baking causes the shrink agent 14 to thermally shrink. Along with this step, stress acts on the resist 12 in a direction indicated by an arrow 16. In other words, the resist 12 is pulled toward the center of the opening portion 13. Therefore, the resist 12 follows the thermal shrinkage of the shrink agent 14, so that the width of the opening portion 13 decreases.

Here, the resist 12 is not easily deformed at the top surface of the resist 12 and a contact portion of the resist 12 with the substrate 10. Therefore, a side surface 15 of the resist 12 which forms the opening portion 13 is easily greatly deformed at a central portion in the thickness direction of the resist 12. Therefore, in the shrinking step, the side surface 15 of the resist 12 which forms the opening portion 13 forms a curved surface protruding toward the center portion of the opening portion 13 at the central portion in the thickness direction of the resist 12.

Figure 5:
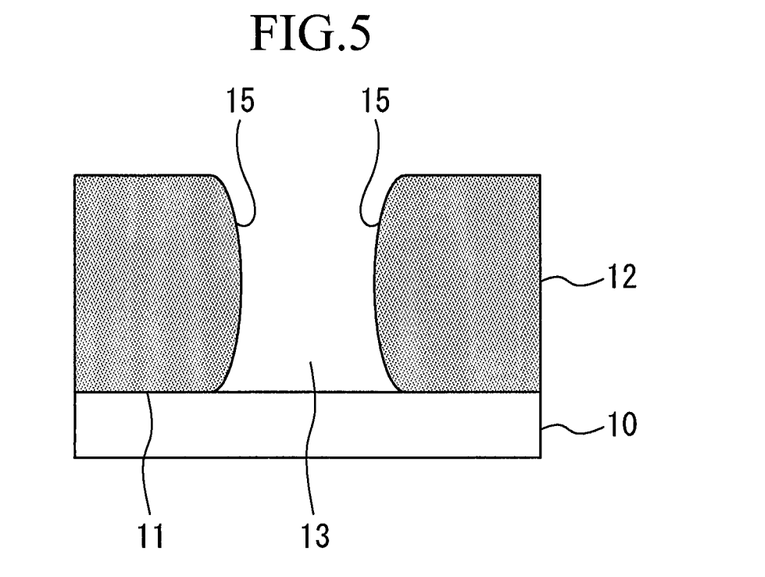
FIG. 5 is a diagram showing the removing step of the first embodiment.

Next, a removing step is performed. FIG. 5 is a diagram showing the removing step of the first embodiment. In the removing step, the shrink agent 14 is removed after the shrinking step. Here, the shrink agent 14 is subjected to a water-washing treatment to be removed. From the foregoing, a resist pattern having the narrowed opening portion 13 can be obtained.

As shown in FIG. 5, with respect to the opening portion 13, the width at the central portion in the thickness direction of the resist 12 is smaller than the widths at the bottom and top surfaces of the resist 12. In the present embodiment, the width of the opening portion 13 is smallest at half the height of the thickness of the resist 12. The side surface 15 is arc-shaped in cross-sectional view. The width of the opening portion 13 depends on baking temperature. In the present embodiment, the width of the opening portion 13 is reduced by about 0.10 to 0.20 μm, and becomes equal to 0.20 μm to 0.30 μm. Here, the width of the opening portion 13 indicates a value at a portion where the width of the opening portion 13 is smallest.

Figure 6:
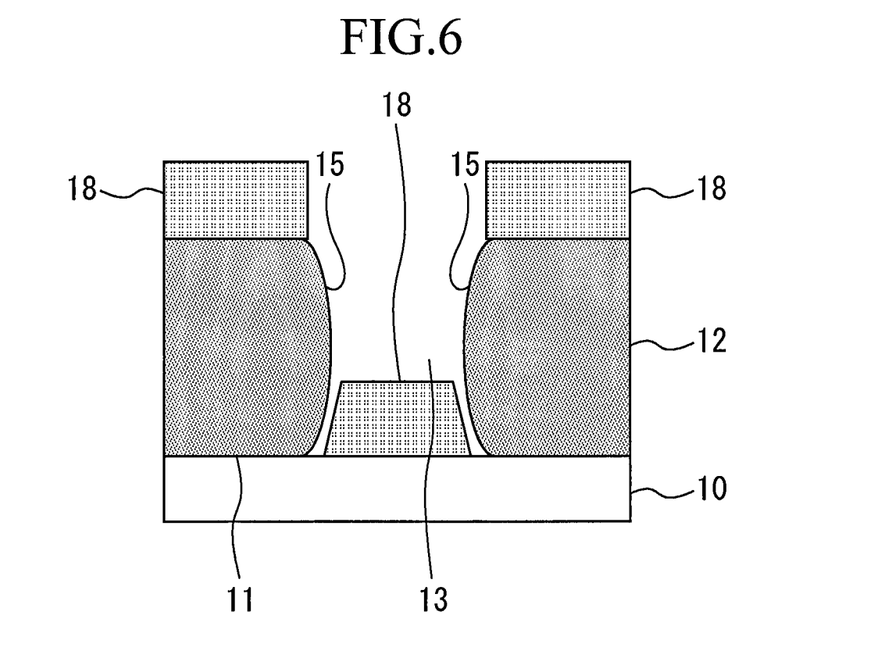
FIG. 6 is a diagram showing the metal layer forming step of the first embodiment.

Next, a metal layer forming step is performed. FIG. 6 is a diagram showing the metal layer forming step of the first embodiment. In the metal layer forming step, a metal layer 18 is formed on the resist 12 and in the opening portion 13 after the removing step. In the opening portion 13, the metal layer 18 is formed on the upper surface 11 of the substrate 10. The metal layer 18 is formed by vapor deposition or sputtering. The thickness of the metal layer 18 is set to be not more than half the thickness of the resist 12. In the present embodiment, the thickness of the metal layer 18 is 0.4 μm or less.

In the metal layer forming step, the metal layer 18 is formed by depositing the material of the metal layer 18 from a direction perpendicular to the upper surface 11 of the substrate 10. At this time, the material of the metal layer 18 is blocked by the side surface 15 protruding toward the center portion of the opening portion 13. Therefore, the material of the metal layer 18 is not deposited at an edge portion of a portion exposed by the opening portion 13 of the substrate 10. Therefore, the metal layer 18 is not formed at the edge portion of the portion exposed by the opening portion 13 of the substrate 10. In other words, the width of the bottom surface of the metal layer 18 formed in the opening portion 13 is smaller than the width of the opening portion 13 on the substrate 10.

Furthermore, the metal layer 18 is not formed on the side surface 15. Accordingly, the metal layer 18 is divided into a portion provided on the top surface of the resist 12 and a portion formed in the opening portion 13. The method of forming the metal layer 18 is not limited to this method.

Figure 7:
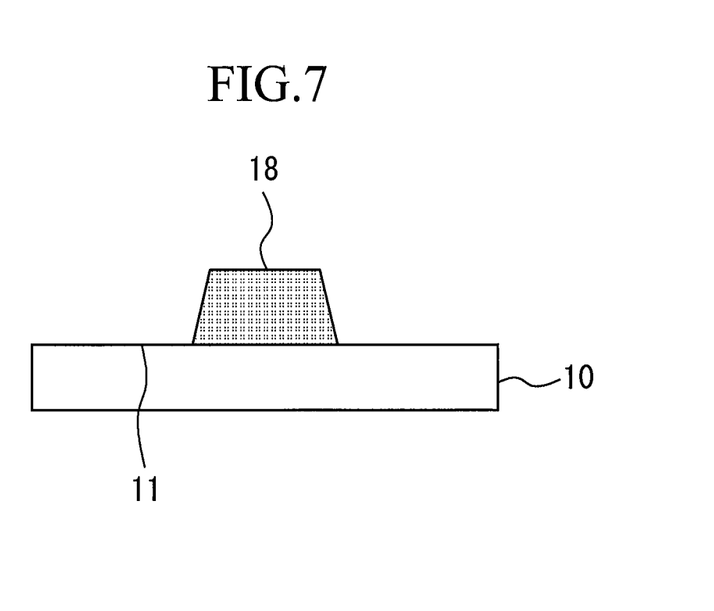
FIG. 7 is a cross-sectional view showing a state in which the resist has been removed in the first embodiment.

Next, the resist 12 is removed by lift-off. FIG. 7 is a cross-sectional view showing a state in which the resist 12 has been removed in the first embodiment. Here, a part of the metal layer 18 is removed by using the resist 12 as a mask.

As a result, a portion of the metal layer 18 above the resist 12 and the resist 12 are removed. From the foregoing, the metal layer 18 is formed on the substrate 10. The metal layer 18 is, for example, a gate electrode.

In general, the resolution limit of the photoresist is 0.4 μm. In the present embodiment, the thermal shrinkage of the shrink agent 14 makes it possible to reduce the width of the opening portion 13 of the resist 12 to the resolution limit of the photoresist or less. Accordingly, the dimension of the metal layer 18 which is an electrode pattern can be reduced. In addition, it is not necessary to use electron beam exposure to reduce the width of the opening portion 13. Therefore, the throughput can be increased and the productivity can be enhanced.

In general, it is desirable in an electrode forming process based on lift-off that the opening portion provided in the resist is not completely filled with the metal layer. Therefore, the cross-sectional shape of the side surface which forms the opening portion of the resist is formed, for example in a reverse tapered shape or overhanging shape in some cases. On the other hand, in the present embodiment, the side surface 15 forms a curved surface protruding toward the center portion of the opening portion 13 at the central portion in the thickness direction of the resist 12. When the metal layer 18 is deposited, the protruding structure of the side surface 15 causes the metal layer 18 to be divided into a portion of the metal layer 18 which is provided on the top surface of the resist 12 and a portion of the metal layer 18 which is provided on the upper surface 11 of the substrate 10. Accordingly, in the present embodiment, the opening portion 13 enabling lift-off can be obtained.

Figure 8:
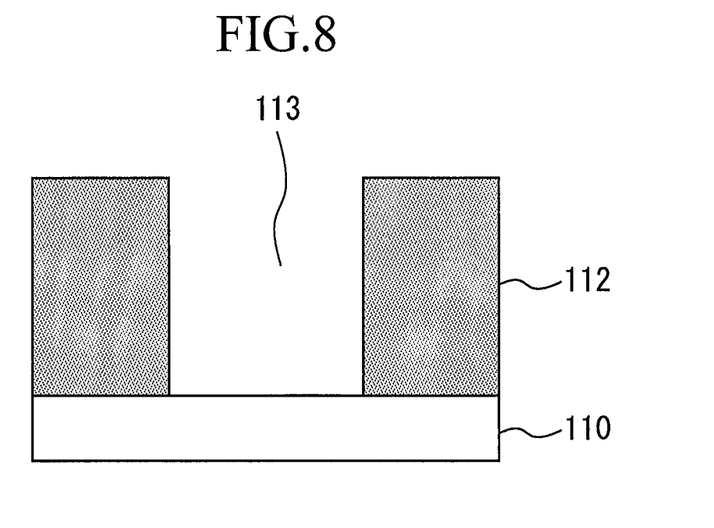
FIG. 8 is a cross-sectional view showing a method of manufacturing a semiconductor device according to a first comparative example.
Figure 9:
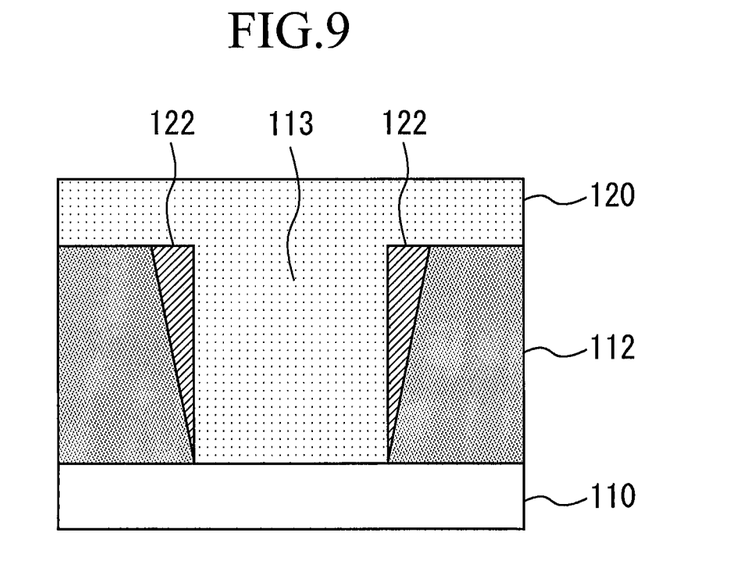
FIG. 9 is a cross-sectional view showing a state where the swelling agent is provided on the resist in the first comparative example.

FIG. 8 is a cross-sectional view showing a method of manufacturing a semiconductor device according to a first comparative example. First, as shown in FIG. 8, an opening portion 113 is provided in a resist 112 to expose a substrate 110. Next, a swelling agent 120 is provided on the resist 112 so as to fill the opening portion 113. FIG. 9 is a cross-sectional view showing a state where the swelling agent 120 is provided on the resist 112 in the first comparative example. Here, a region 122 having a high hydrophilicity is spread in the vicinity of the opening portion 113 of the resist 112.

Figure 10:
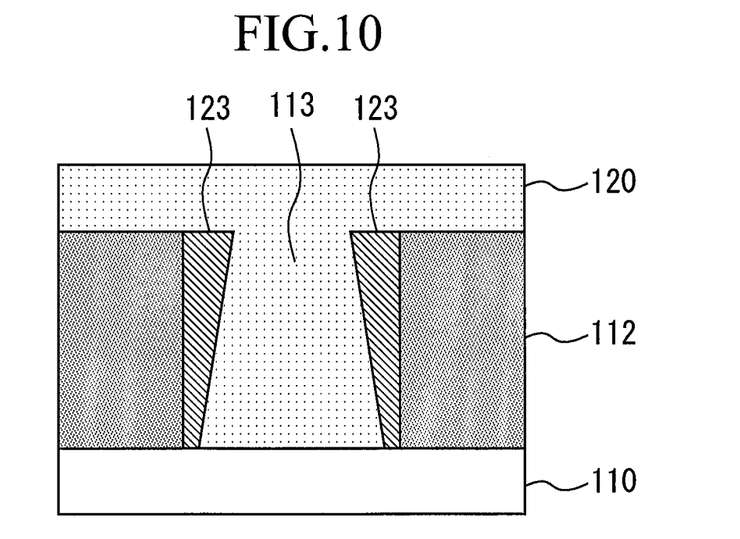
FIG. 10 is a cross-sectional view showing a state where the mixing region has been formed in the resist in the first comparative example.
Figure 11:
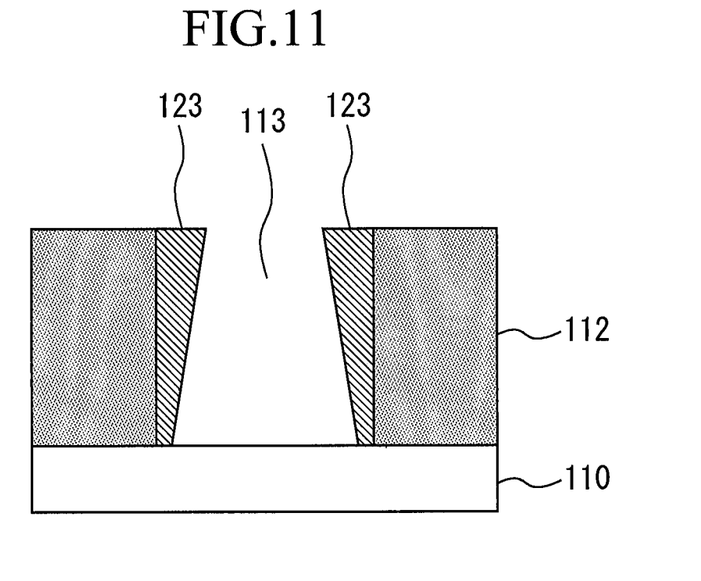
FIG. 11 is a cross-sectional view showing a state where the swelling agent has been removed in the first comparative example.

Next, baking is performed to mix the resist 112 and the swelling agent 120 in the high-hydrophilicity region 122, thereby forming a mixing region 123. FIG. 10 is a cross-sectional view showing a state where the mixing region 123 has been formed in the resist 112 in the first comparative example. Baking is further performed to crosslink the mixing region 123. Next, the swelling agent 120 is removed. FIG. 11 is a cross-sectional view showing a state where the swelling agent 120 has been removed in the first comparative example.

Generally, when a photoresist is patterned, a resist residue is generated at the bottom of the opening portion. In the method of manufacturing a semiconductor device according to the first comparative example, the resist residue may grow due to a chemical reaction by the swelling treatment. In this case, it may be difficult to remove the resist residue.

On the other hand, in the present embodiment, the shrink agent 14 does not react with the resist 12. Therefore, the resist residue remaining in the opening portion 13 does not grow, and the resist residue can be easily removed. The removal of the resist residue is performed in a pretreatment of the metal layer forming step.

Figure 12:
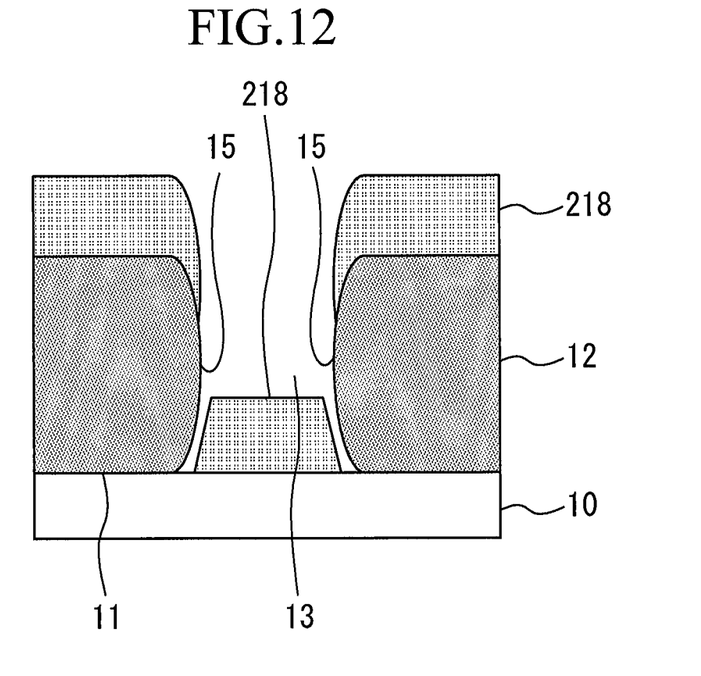
FIG. 12 is a cross-sectional view showing a method of manufacturing a semiconductor device according to a modification of the first embodiment.

FIG. 12 is a cross-sectional view showing a method of manufacturing a semiconductor device according to a modification of the first embodiment. As shown in FIG. 12, a metal layer 218 may cover a part of the side surface 15 forming the opening portion 13 of the resist 12. In this case, the metal layer 218 is also divided into a portion formed on the top surface of the resist 12 and a portion formed in the opening portion 13 by the protruding side surface 15.

Figure 13:
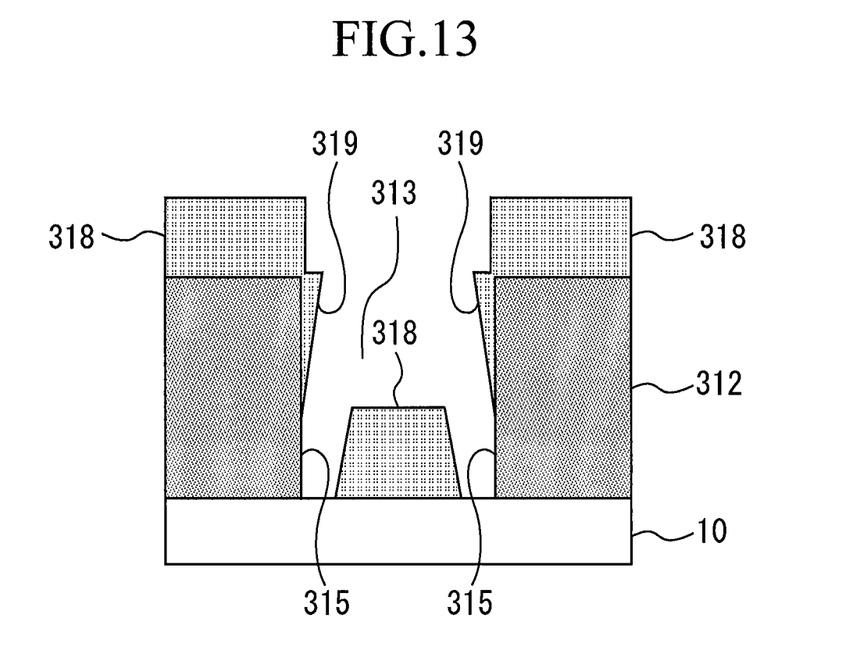
FIG. 13 is a cross-sectional view showing a method of manufacturing a semiconductor device according to a second comparative example.

FIG. 13 is a cross-sectional view showing a method of manufacturing a semiconductor device according to a second comparative example. In the second comparative example, the width of an opening portion 313 formed in a resist 312 is constant. In this structure, when a metal layer 318 is formed, a metal layer 319 may be also formed on a side surface 315 forming the opening portion 313. A breaking easily occurs between the metal layer 318 on the top surface of the resist 312 and the metal layer 319 on the side surface 315. At this time, the metal layer 319 may drop into the opening portion 313 at the time of lift-off A case where the width of the opening portion 313 is constant is shown in FIG. 13, but dropping may likewise occur in a case where the opening portion is reversely tapered in a cross-sectional view like the opening portion 113 shown in the first comparative example. Dropping of the metal layer 319 may lead to process failure.

On the other hand, in the method of manufacturing a semiconductor device according to the modification of the first embodiment shown in FIG. 12, even when the metal layer 218 is formed on the side surface 15, a breaking of the metal layer 218 is made difficult to occur by the side surface 15 protruding toward the center portion of the opening portion 13. The side surface 15 also forms a curved surface at the boundary between the top surface and the side surface 15 of the resist 12. Therefore, the breaking of the metal layer 218 is more difficult to occur at the boundary between the top surface and the side surface 15 of the resist 12. Therefore, it is possible to suppress the dropping of the metal layer 218 at the time of lift-off.

In the present embodiment, a positive resist is used as the resist 12. The resist 12 is not limited to this type, and a resist such as a negative resist, an image reversal resist, or an EB (Electron Beam) resist may be used. In this case, a resist shape similar to that of the first embodiment can be obtained.

In the present embodiment, the metal layer 18 is assumed to be a gate electrode. The metal layer 18 is not limited to this form, and it may be any member insofar as it can be obtained by a metal layer forming process based on lift-off. In the present embodiment, the metal layer 18 having a thickness of 0.4 μm or less which is half or less of the film thickness of the resist 12 is formed. The thickness of the metal layer 18 is not limited to this thickness. For example, the present embodiment can be applied to the formation of a metal layer having a thickness of 0.4 μm or more.

These modifications can be applied, as appropriate, to a method of manufacturing a semiconductor device according to the following embodiments. Note that the method of manufacturing the semiconductor device according to the following embodiments are similar to those of the first embodiment in many respects, and thus differences between the method of manufacturing the semiconductor device according to the following embodiments and those of the first embodiment will be mainly described below.

Second Embodiment

Figure 14:
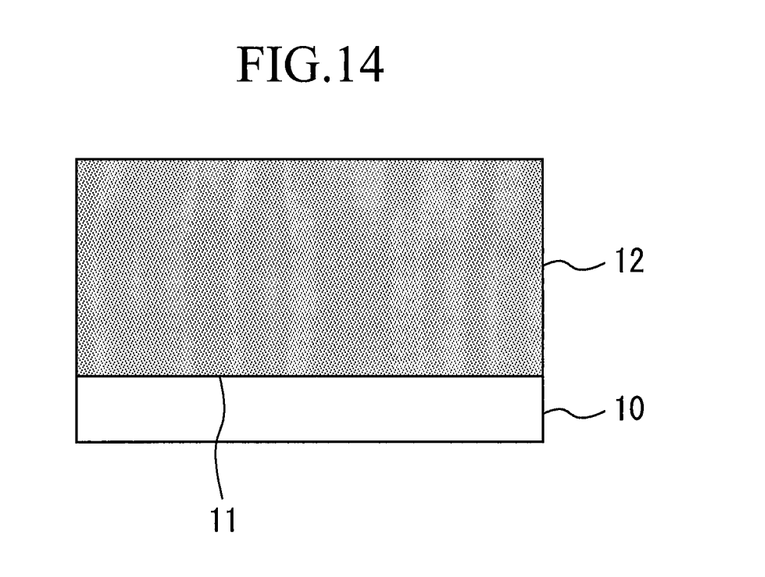
FIG. 14 is a cross-sectional view showing a method of manufacturing a semiconductor device according to a second embodiment.
Figure 15:
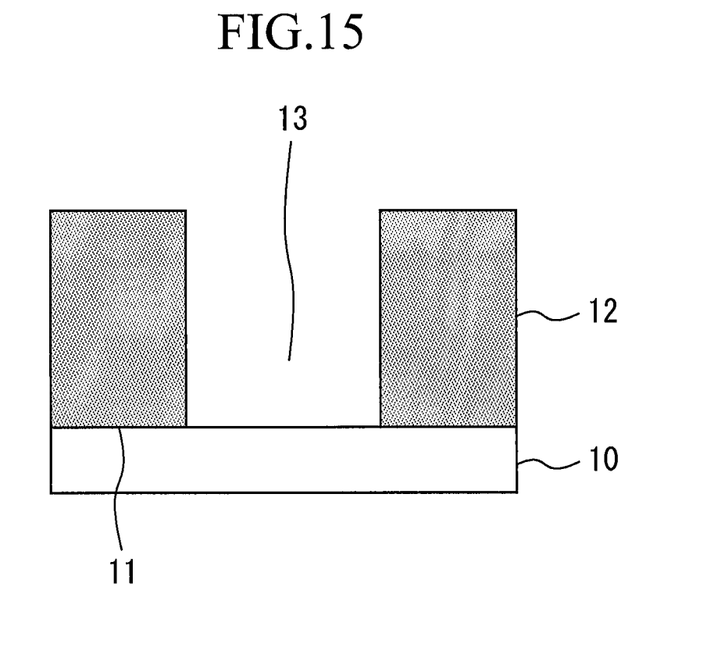
FIG. 15 is a cross-sectional view showing a state where the opening portion is provided in the resist in the second embodiment.

FIG. 14 is a cross-sectional view showing a method of manufacturing a semiconductor device according to a second embodiment. In the first embodiment, pattern shrinkage is performed only once. On the other hand, pattern shrinkage may be repeatedly performed. In the present embodiment, the resist 12 is formed on the upper surface 11 of the substrate 10 as in the case of the first embodiment. Next, an opening portion 13 is provided in the resist 12 to expose the substrate 10. FIG. 15 is a cross-sectional view showing a state where the opening portion 13 is provided in the resist 12 in the second embodiment.

Figure 16:
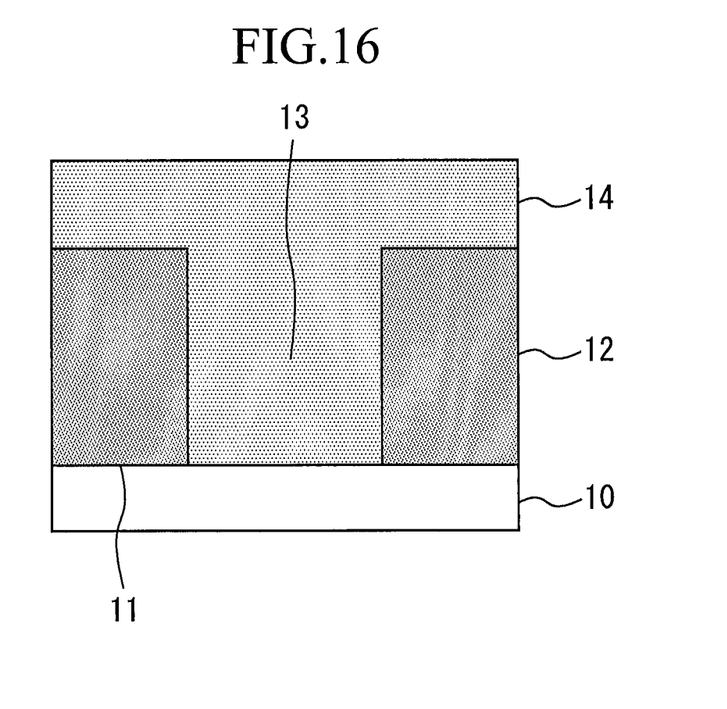
FIG. 16 is a diagram showing a shrink agent coating step of the second embodiment.

FIG. 16 is a diagram showing a shrink agent coating step of the second embodiment. In the shrink agent coating step, a shrink agent 14 is coated on the resist 12 so as to fill the opening portion 13 as in the case of the first embodiment. Next, a shrinking step is performed. In the shrinking step, the shrink agent 14 is baked at 110° C. to 130° C. to be thermally shrunk. As a result, the resist 12 is pulled by the shrink agent 14, so that the width of the opening portion 13 is reduced.

Figure 17:
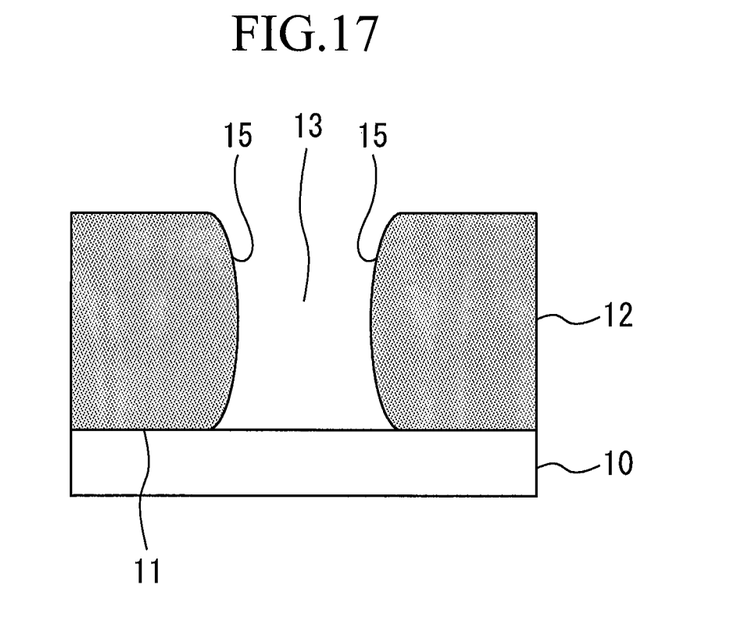
FIG. 17 is a diagram showing the removing step of the second embodiment.

Next, a removing step is performed. FIG. 17 is a diagram showing the removing step of the second embodiment. In the removing step, the shrink agent 14 is removed by a water-washing treatment. From the foregoing, a resist pattern having the width-reduced opening portion 13 can be obtained.

Figure 18:
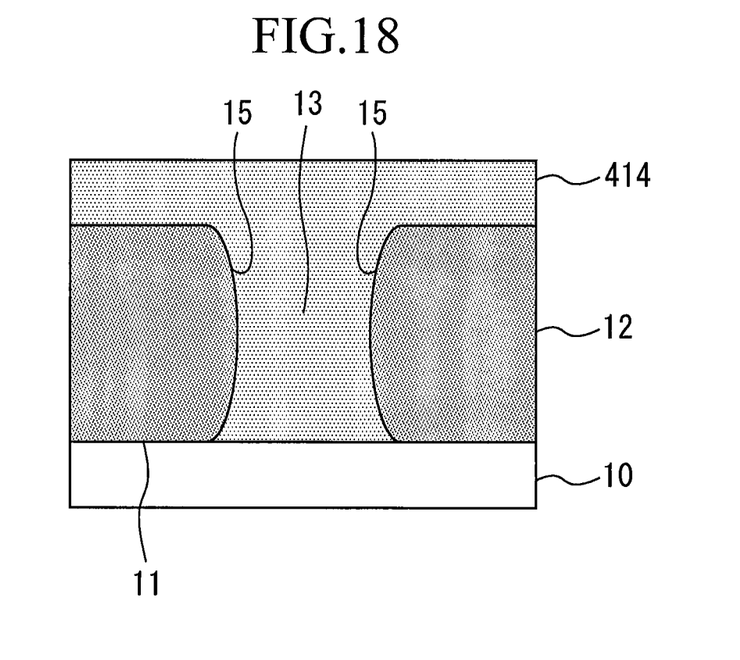
FIG. 18 is a diagram showing a state where the shrink agent coating step is performed after the removing step.

Next, a shrink agent coating step is further performed. FIG. 18 is a diagram showing a state where the shrink agent coating step is performed after the removing step. In this shrink agent coating step, a thermally-shrinking shrink agent 414 is coated on the resist 12 to fill the opening portion 13. The shrink agent 414 may be the same kind as the shrink agent 14. Next, a shrinking step is performed. In the shrinking step, the shrink agent 414 is baked at 110° C. to 130° C. to be thermally shrunk. As a result, the resist 12 is pulled by the shrink agent 414, so that the width of the opening portion 13 is further reduced.

Figure 19:
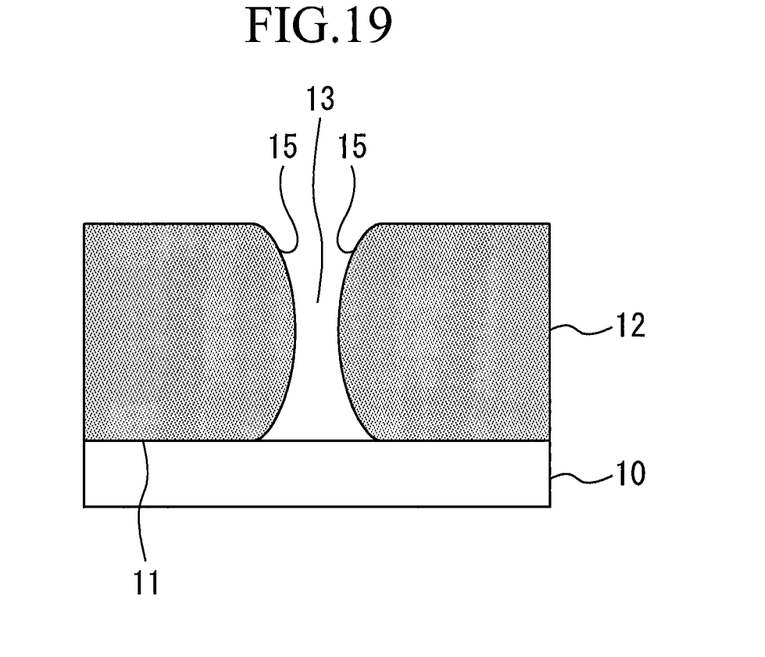
FIG. 19 is a cross-sectional view showing a state where the width of the opening portion has been further reduced.

Next, a removing step is performed. In the removing step, the shrink agent 414 is removed by a water-washing treatment. FIG. 19 is a cross-sectional view showing a state where the width of the opening portion 13 has been further reduced. From the foregoing, a resist pattern in which the width of the opening portion 13 is further reduced as compared with that of the first embodiment is obtained.

Figure 20:
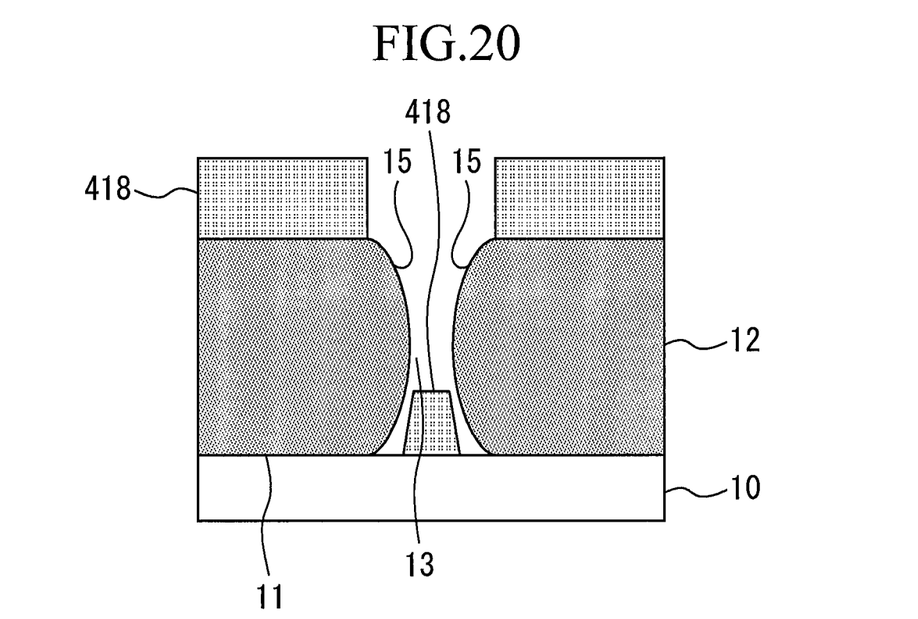
FIG. 20 is a diagram showing a metal layer forming step of the second embodiment.

Next, a metal layer forming step is performed. FIG. 20 is a diagram showing a metal layer forming step of the second embodiment. In the metal layer forming step, a metal layer 418 is formed on the upper surface 11 of the substrate 10 in the opening portion 13 and on the resist 12. The metal layer 418 is formed by vapor deposition or sputtering.

Figure 21:
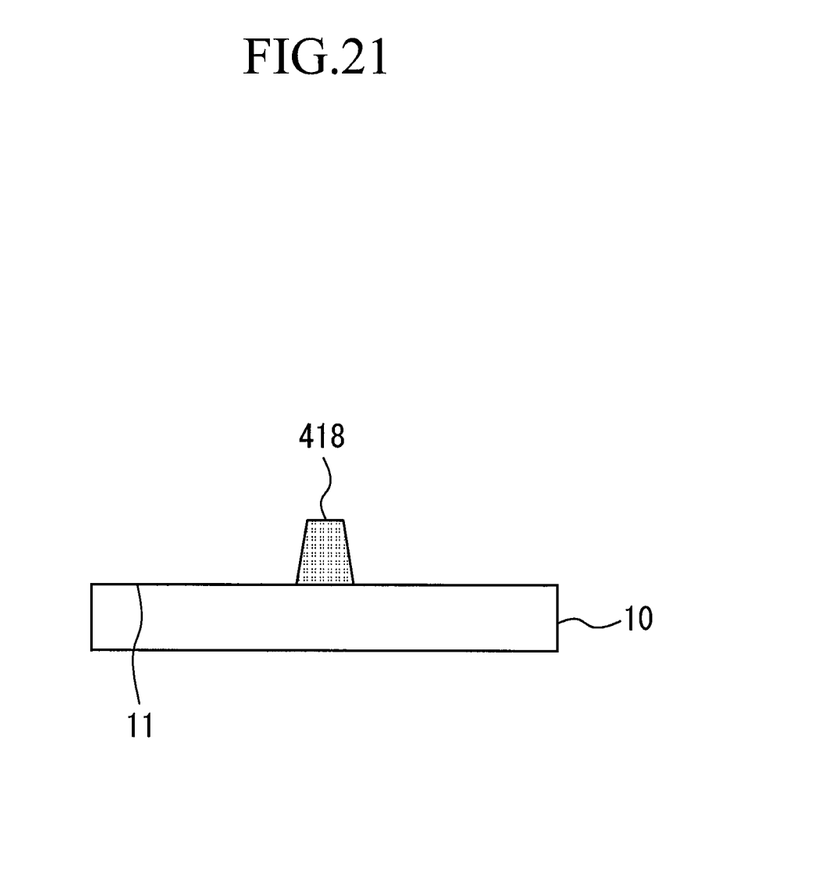
FIG. 21 is a cross-sectional view showing a state where the resist has been removed in the second embodiment.

Next, the resist 12 is removed by lift-off. FIG. 21 is a cross-sectional view showing a state where the resist 12 has been removed in the second embodiment. As a result, a portion of the metal layer 418 above the resist 12 and the resist 12 are removed. From the foregoing, the metal layer 418 is formed on the substrate 10.

In the present embodiment, the shrink agent coating step, the shrinking step, and the removing step are repeatedly performed before the metal layer forming step. As a result, an electrode pattern having a smaller width than that of the first embodiment can be obtained.

Here, the number of repetitions of the pattern shrinkage may be more than two. The shrink agent coating step, the shrinking step and the removing step are repeated until the width of the opening portion 13 reaches a target width. According to the present embodiment, it is possible to obtain the opening portion 13 having a width of about 0.10 μm at the minimum.

In the method of manufacturing a semiconductor device according to the first comparative example, the resist 112 and the swelling agent 120 are chemically reacted with each other to reduce the width of the opening portion 113. Therefore, when the swelling treatment is repeated, the opening portion 113 may be clogged in a submicron region of 0.1 μm. Therefore, the minimum finished dimension of the opening portion 113 may be about 0.2 μm.

On the other hand, in the present embodiment, the shrink agents 14 and 414 do not react with the resist 12. Therefore, even when the pattern shrinkage is repeatedly performed, the opening portion 13 is not clogged. Therefore, the pattern shrinkage can be performed repeatedly. As a result, the opening portion 13 can be further narrowed. As a result, the opening portion 13 having a width of 0.1 μm can be formed with high accuracy.

Next, a method of obtaining a metal layer 18 having a thickness of x μm and a width of y μm will be described. First, a resist 12 having a thickness of 2× μM or more is coated on a substrate 10. Next, an opening portion 13 having a width of y μm or more is formed in the resist 12. Next, the shrink agent coating step, the shrinking step, and the removing step are repeatedly performed until the width of the opening portion 13 reaches y μm. Next, in the metal layer forming step, a metal layer 18 having a thickness of x μm is formed. Next, the resist 12 is removed by lift-off. From the foregoing, a target thickness x μm of the electrode and a target width y μm of the electrode can be obtained.

Note that the technical features described in the above embodiments may be combined as appropriate.

REFERENCE SIGNS LIST 10 substrate, 11 upper surface, 12 resist, 13 opening portion, 14, 414 shrink agent, 15 side surface, 18, 218 metal layer

The invention claimed is:

1. A method of manufacturing a semiconductor device comprising:
    a step of coating a resist on an upper surface of a substrate;
    a step of forming an opening portion in the resist;
    a shrink agent coating step of coating a shrink agent on the resist to fill the opening portion with the shrink agent, the shrink agent being thermally-shrinking;
    a shrinking step of heating and thermally shrinking the shrink agent to reduce a width of the opening portion;
    a step of removing the shrink agent after the shrinking step;
    a metal layer forming step of forming a metal layer on the resist and in the opening portion after the removing step; and
    a step of removing a portion of the metal layer above the resist and the resist, wherein
    in the shrinking step, a side surface of the resist forming the opening portion forms a curved surface protruding toward a center portion of the opening portion at a central portion in a thickness direction of the resist,
    in the step of removing the shrink agent, the shrink agent is removed by a water-washing treatment, and
    the shrink agent does not react with the resist.

2. The method of manufacturing a semiconductor device according to claim 1, wherein
    the shrink agent coating step, the shrinking step, and the step of removing the shrink agent are repeatedly performed before the metal layer forming step.

3. The method of manufacturing a semiconductor device according to claim 1, wherein
    a thickness of the resist is twice or more as large as a thickness of the metal layer.

4. The method of manufacturing a semiconductor device according to claim 1, wherein in the metal layer forming step, the metal layer is formed by depositing a material of the metal layer from a direction perpendicular to the upper surface of the substrate.

5. The method of manufacturing a semiconductor device according claim 1, wherein
a width of a bottom surface of the metal layer formed in the opening portion is smaller than a width of the opening portion on the substrate.

\* \* \* \* \*